United States Patent [19]
Hidaka

[11] Patent Number: 4,926,377
[45] Date of Patent: May 15, 1990

[54] MAGNETIC MEMORY DEVICE USING A DEFLECTED IN-PLANE MAGNETIC FIELD

[75] Inventor: Yasuharu Hidaka, Tokyo, Japan
[73] Assignee: NEC Corporation, Tokyo, Japan
[21] Appl. No.: 392,863
[22] Filed: Aug. 11, 1989
[30] Foreign Application Priority Data Aug. 11, 1988 [JP] Japan ................... 63-201614

[51] Int. Cl.$^5$ ........................... G11C 19/08
[52] U.S. Cl. ...................... 365/29; 365/27; 365/87
[58] Field of Search ................ 365/29, 27, 28, 87

[56] References Cited

U.S. PATENT DOCUMENTS

| | | | |
|---|---|---|---|
| 4,001,794 | 1/1977 | Voegeli | 365/29 |
| 4,583,200 | 4/1986 | Konishi et al. | 365/29 |
| 4,731,752 | 3/1988 | Hidaka | 365/87 |
| 4,845,671 | 7/1989 | Maruyama et al. | 365/87 |

Primary Examiner—James W. Moffitt
Attorney, Agent, or Firm—Sughrue, Mion, Zinn, Macpeak & Seas

[57] ABSTRACT

In a magnetic memory device for use in selectively carrying out a write-in operation and a readout operation of a pair of vertical Bloch lines as an information carrier in a domain wall of a stripe domain extended along a longitudinal direction, a deflected in-plane magnetic field is applied to an end portion of the stripe domain and deflected relative to the longitudinal direction at an angle within an angle range by the use of a pair of magnetic units. The deflected in-plane magnetic field serves to stably hold a single Bloch line to a predetermined flank wall of the stripe domain during the write-in operation or to stably separate three Bloch lines from one another during the readout operation. Such application of the deflected in-plane magnetic field also serves to smoothly propagate each Bloch line.

4 Claims, 12 Drawing Sheets

4,926,377

MAGNETIC MEMORY DEVICE USING A DEFLECTED IN-PLANE MAGNETIC FIELD

BACKGROUND OF THE INVENTION

This invention relates to a nonvolatile magnetic memory device which will simply be called a magnetic memory device or a Bloch line memory hereinafter and which memorizes information by using a pair of vertical Bloch lines in a domain wall of a stripe domain.

Magnetic memory devices of the type described are disclosed in U.S. Pat. Nos. 4,583,200 and 4,731,752 issued to Susumu Konishi et al and to Yasuharu Hidaka on April 15, 1986 and on March 15, 1988, respectively. Such a magnetic memory device uses a stripe domain which is extended along a predetermined direction in a magnetic medium, such as a ferrimagnetic garnet layer, and which has a pair of heads and an intermediate portion between the heads. The stripe domain is surrounded in the magnetic medium by a closed domain wall which has a pair of end walls and a pair of flank walls connected to the end walls.

Under the circumstances, a pair of vertical Bloch lines is written or injected as an information carrier or unit into the domain wall of the stripe domain and read out of or taken out from the stripe domain. For this purpose, the magnetic memory device comprises a write-in circuit and a readout circuit both of which are coupled to write-in and readout ends or end portions of the stripe domain in the vicinity of the heads of the stripe domain. In addition, a propagation circuit is included in the magnetic memory device so as to propagate each of the Bloch line pair from the write-in end to the readout end.

More specifically, a stripe domain is chopped by the use of the write-in circuit into a useless bubble and a remaining stripe domain into which the Bloch line pair is injected. On the other hand, the readout circuit stretches a stripe domain and also chops the stripe domain head into an information bubble and a remnant stripe domain. The information bubble conveys effective information injected into the stripe domain.

At any rate, each of the Bloch lines or each pair of the Bloch lines should be accurately located in place at the write-in and the readout ends in the predetermined direction on write-in and readout operations, respectively. To this end, an in-plane magnetic field is applied in the predetermined direction by the use of a magnetic device. However, it is very difficult to locate the Bloch line or Bloch line pair in place along the predetermined direction. This often brings about difficulty of controllability in the Bloch line or Bloch line pair and gives rise to malfunctions in the write-in and the readout operations.

SUMMARY OF THE INVENTION

It is an object of this invention to provide a magnetic memory device which is capable of improving controllability of a Bloch line or a Bloch line pair.

It is another object of this invention to provide a magnetic memory device of the type described, which is capable of reducing malfunctions which might occur in write-in and readout operations.

A magnetic memory device to which this invention is applicable is for use in selectively carrying out a write-in operation and a readout operation of a pair of vertical Bloch lines as an information carrier in a domain wall of a stripe domain which is extended in a magnetic medium along a predetermined direction. According to this invention, the magnetic memory device comprises magnetic field applying means for applying a deflected in-plane magnetic field which is deflected at an angle relative to the predetermined direction and operation control means for selectively controlling the write-in and the readout operations of the vertical Bloch line pair with the deflected in-plane magnetic field applied onto the stripe domain to carry out the write-in and the readout operations.

DESCRIPTION OF THE PREFERRED EMBODIMENTS

Referring to FIGS. 1(a) through (c) and FIG. 2, a conventional magnetic memory device will be described at first for a better understanding of this invention. The illustrated magnetic memory device is substantially equivalent to that described in the paper referenced in the preamble of the instant specification and comprises a magnetic medium 21, such as a garnet layer, which has a principal surface directed frontwards of the figure and an easy axis of magnetization orthogonal to the principal surface. Thus, the magnetic medium 21 exhibits uniaxial anisotropy. A stripe domain 22 is formed in the magnetic medium 21 and is surrounded by a domain wall 23 depicted at a single line in FIG. 1, although the domain wall 23 has a certain thickness. The illustrated magnetic medium 21 may be recognized as a part of a chip on which a great number of stripe domains are arranged in parallel.

Figure 1A:
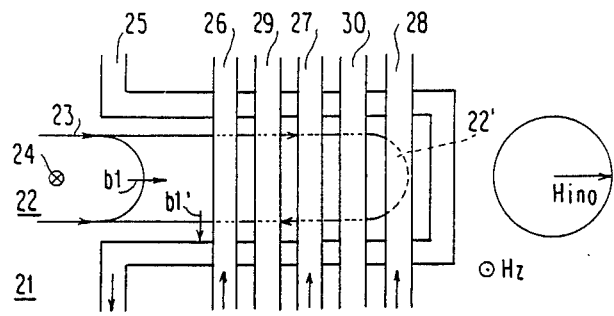
FIGS. 1(a) through (c) are plan views for use in describing a write-in operation of a conventional magnetic memory device.

As shown in FIG. 1(a), if a bias magnetic field Hz is directed frontwards of FIG. 1 from the principal surface, as depicted at an encircled dot, magnetization is directed within the stripe domain 22 backwards of the figure, as shown by an encircled crisscross 24. The stripe domain 22 is longitudinally extended along a predetermined direction which may be horizontal in FIGS. 1 and 2. As known in the art, the stripe domain 22 has a pair of end portions and an intermediate portion between the end portions while the domain wall has a pair of end walls and a pair of flank walls connected to the end walls. A pair of vertical Bloch lines is injected or written into the stripe domain 22 by the use of a write-in circuit supplied with an information signal and is read or taken out from the stripe domain 22 by the use of a readout circuit. The write-in and the readout circuits are located in the vicinity of the end portions of the stripe domain 22.

Figure 1B:
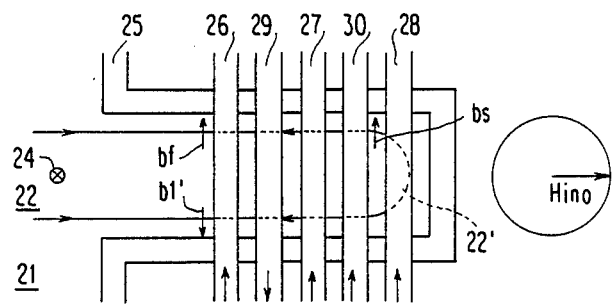
Figure 1C:
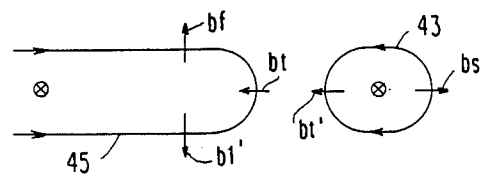
Figure 2:
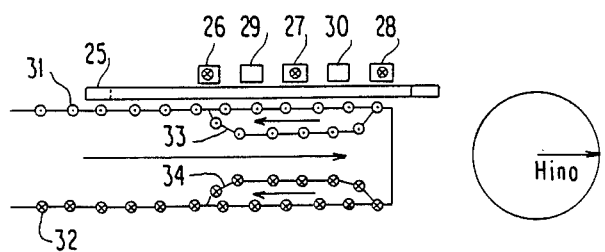
FIG. 2 shows, in cross section, a stripe domain illustrated in FIGS. 1(a) through (c) to describe the write-in operation of the conventional magnetic memory device.

In FIGS. 1 and 2, a selected one of the end portions of the stripe domain 23 alone is illustrated together with the write-in circuit. At first, the selected end portion of the stripe domain 23 is located at a position depicted at a solid line. The write-in circuit comprises a hairpin-shaped conductor 25 adjacent to the selected end portion of the stripe domain 23, first through third conductors 26, 27, and 28 which intersect the hairpin-shaped conductor 25 and which are extended parallel to one another with spacings left between adjacent ones of them. In addition, fourth and fifth conductors 29 and 30 are laid between the first and the third conductors 26 and 27 and between the second and the third conductors 27 and 28, respectively, and are extended in parallel to the first through third conductors 26 to 28. The first through fifth conductors 26 to 30 are connected to a control circuit through a write-in current source. The control circuit and the write-in current source may be similar to those illustrated in the above-referenced U.S. Pat. No. 4,583,200, respectively, and may not be therefore described any longer.

Description will be made about a write-in operation of writing a pair of vertical Bloch lines into the stripe domain 22 in response to an information signal. The write-in operation is assumed to be carried out in accordance with a method mentioned in the above-mentioned paper. In this event, an in-plane magnetic field Hino is statically applied in the predetermined direction, namely, the longitudinal direction of the stripe domain 22. The illustrated in-plane magnetic field Hino is oriented in a rightward sense of FIG. 1(a), as illustrated within a circle in FIG. 1(a). A single Bloch line depicted at b1 is kept at a center position or extremity of the selected end portion of the stripe domain 22 shown by the solid line due to the application of the in-plane magnetic field Hino. In order to carry out the write-in operation of the Bloch line pair, the single Bloch line b1 must be shifted to either one of the flank walls of the stripe domain 22 to put the selected end portion of the stripe domain 22 into a predetermined state wherein no Bloch line is located. Such a predetermined state may be called a $\chi$-state while such a stripe domain may be referred to as a $\chi$-stripe domain. In the example being illustrated, the single Bloch line should be shifted towards a lower one of the flank walls of the stripe domain 22. At any rate, the Bloch line pair is written into the selected end portion of the $\chi$-stripe domain with the single Bloch line b1 shifted to the lower flank wall.

More specifically, the stripe domain 22 depicted at the solid line must be stretched rightwards of FIG. 1(a) by giving electric currents to flow through the first through the third conductors 26 to 28 upwards of FIG. 1(a), as depicted at upward arrows. In this event, the current is simultaneously supplied to the hairpin-shaped conductor 25 from the write-in current source with a pulsed current which generates a local pulsed in-plane magnetic field Hip in the magnetic medium 21. The local pulsed in-plane magnetic field Hip is directed in a leftward sense of FIG. 1(a), although not shown in FIG. 1(a). As a result, the selected end portion of the stripe domain 22 is stretched as a stretched stripe domain 22' rightwards of FIG. 1(a). While the end portion is being stretched, gyrotropic force acts on the single Bloch line b1 clockwise. Accordingly, the single Bloch line b1 is moved by the gyrotropic force towards the lower flank wall of FIG. 1(a) and stabilized at a position placed on the lefthand side of the first conductor 26 due to interaction between the gyrotropic force and the single Bloch line b1, as depicted at b1'. Under the circumstances, the stretched stripe domain 22' has a head portion which is put into the desired $\chi$-state on the righthand side of the first conductor 26, as shown in FIG. 1(a).

Referring to FIG. 2 in addition to FIG. 1(a), the stretched stripe domain 22' has the upper flank wall of FIG. 1(a) which has an upper portion and a bottom portion. Wall magnetization 31 on the upper portion is oriented in a frontward sense of the figure while wall magnetization 32 on the bottom portion is directed in a backward sense of the figure. In this situation, horizontal Bloch lines 33 and 34 are formed in the flank wall along the upper and the bottom portions, respectively, when the first through the third conductors 26 to 28 are supplied with the electric currents in the above-mentioned manner.

When the electric currents are given to flow through the first through the third conductors 26 to 28 with the stripe domain 22' stretched like in FIG. 1(a), the local pulsed bias field Hip is generated in parallel to the bias magnetic field Hz under the first through the third conductors 26 to 28, as mentioned before. As a result, the horizontal Bloch lines 34 are dynamically moved among the first through the third conductors 26 to 28 upwards of FIG. 2. Finally, punch-through takes place between the horizontal Bloch lines 33 and 34 to transiently inject or write the vertical Bloch line pair into the domain wall. The vertical Bloch line pair is composed of a first Bloch line bf located on the lefthand side of the first conductor 26 and a second Bloch line bs located on the lefthand side of the third conductor 28, as shown in FIG. 1(b). The first and the second Bloch lines, bf and bs, are transiently kept in the domain wall during presence of the local pulsed in-plane field Hip and are extinct when the local pulsed in-plane field Hip disappears.

Taking this into consideration, electric currents are given to flow through the fourth and the fifth conductors 29 and 30 in opposite senses, as illustrated in FIG. 1(b) and to give a magnetic field to the stretched stripe domain 22'. Such a magnetic field serves to chop the stretched stripe domain 22' into a magnetic bubble 43 and a remaining stripe domain 45. As a result, a pair of vertical Bloch lines bs and bt of a negative type is left in the remaining stripe domain 45, as illustrated in FIG. 1(c). On the other hand, another pair of vertical Bloch lines bf and bt' remains in the magnetic bubbles 43 which is not used in the magnetic memory device.

Referring to FIGS. 3(a) through (d), description will be made as regards a readout operation of a pair of Bloch lines in the conventional magnetic memory device. Such a readout operation can be carried out by the use of the readout circuit which comprises conductors similar to those of the write-in circuit. Therefore, the same reference numerals are used in FIG. 3 to describe the readout operation. At first, an end portion of a stripe domain 22 is located at a position adjacent to the hairpin-shaped conductor 25, as shown by a broken line in FIG. 3(a), with the in-plane magnetic field Hino applied in a rightward sense of FIG. 3(a). At an extremity of the end portion of the stripe domain, three of Bloch lines are arranged in parallel and may be individually named a center Bloch line bc and lefthand and righthand Bloch lines b2 and b3 which are placed on the lefthand and the righthand sides of the center Bloch line bc, respectively.

Figure 3A:
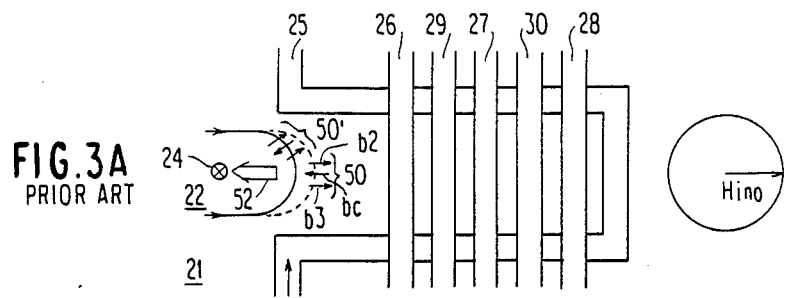
FIGS. 3(a) through (d) are plan views for use in describing a readout operation of the conventional magnetic memory device.

Under the circumstances, an electric current is given to flow through the hairpin-shaped conductor 25 in an upward sense depicted at an arrow in FIG. 3(a). The electric current generates a magnetic field on a lefthand sense of FIG. 3(a), as shown by a thick arrow 52 in FIG. 3(a). As a result, the end portion of the stripe domain is somewhat retracted leftwards of FIG. 3(a) to form a retracted stripe domain, as depicted at a solid line. In this case, the Bloch lines 50 are at first shifted from the extremity of the end portion towards the upper flank wall of FIG. 3(a), as shown by 50'.

Figure 3B:
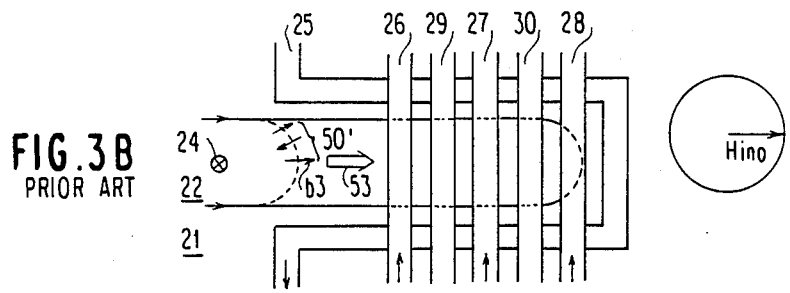
Figure 3C:
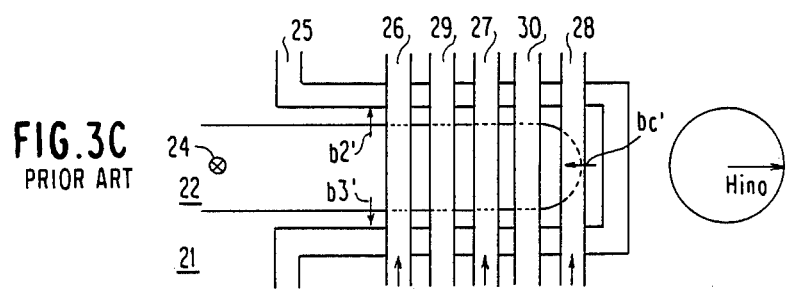
Figure 3D:
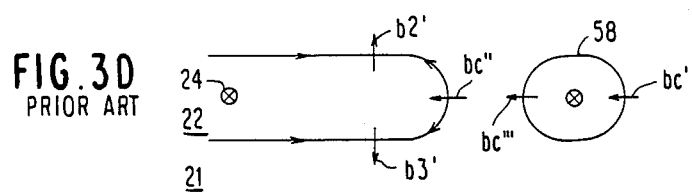

Thereafter, only the righthand Bloch line b3 is returned back to the extremity of the retracted stripe domain due to interaction between the in-plane magnetic field Hino and the Bloch lines 50', as shown in FIG. 3(b). When the righthand Bloch line b3 is located at the extremity of the retracted magnetic domain, the first through the third conductors 26 to 28 are supplied with electric currents which are directed upwards of FIG. 3(b) and which are parallel to one another. As a result, a magnetic field Hip depicted at a thick arrow 53 is generated in a rightward sense of FIG. 3(b). Simultaneously, the hairpin-shaped conductor 25 is given a pulsed electric current downwards of FIG. 3(b). Such supply of electric currents enables stretching of the retracted stripe domain rightwards of FIG. 3(b), as shown by a broken line in FIG. 3(b). Thus, the retracted stripe domain is stretched into a stretched stripe domain shown by a broken line in FIG. 3(b).

During the stretching of the retracted stripe domain, gyrotropic force acts on the center and the lefthand side Bloch lines bc, b2, and b3 to shift both the Bloch lines to the upper flank wall. Finally, the three Bloch lines 50' are individually separated from one another with the center Bloch line located at an extremity of the stretched stripe domain, as shown at bc' in FIG. 3(c), and with the lefthand and the righthand side Bloch lines arranged on the lefthand side of the first conductor 26, as illustrated at b2' and b3', respectively.

Thereafter, an electric current is given to flow through the hairpin-shaped conductor 25 in a manner similar to that described in conjunction with FIG. 1(c) to chop the stretched stripe domain into a magnetic bubble 58 and a remaining stripe domain 59 to leave a pair of vertical Bloch lines bc' and bc'' in the magnetic bubble 58 and a vertical Bloch line bc''' in the remaining stripe domain 59, respectively. Thus, the magnetic bubble 58 carries information specified by the vertical Bloch line pair bc' and bc'' and may be called an information bubble. It is therefore possible to read the information out of the magnetic bubble 58 in the known manner.

Figure 4A:
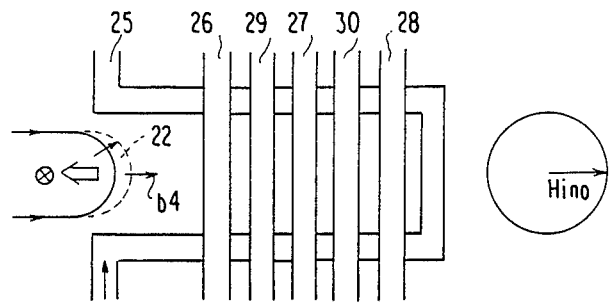
FIGS. 4(a) through (d) are plan views for use in describing a readout operation of the conventional magnetic memory device carried out when a single Bloch line alone is located at an end portion of a stripe domain.
Figure 4B:
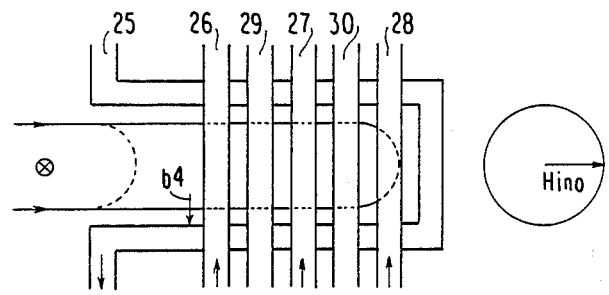
Figure 4C:
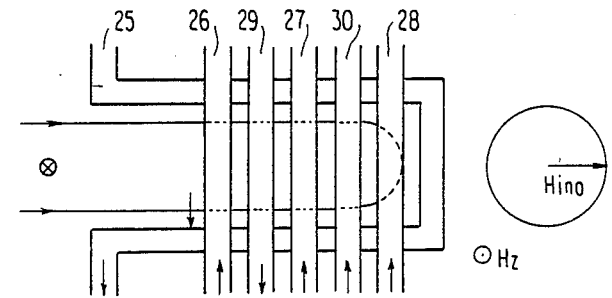
Figure 4D:
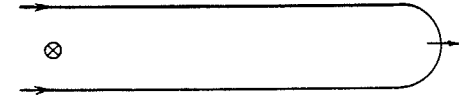

Referring to FIGS. 4(a) through (d), description will be made about a readout operation which is carried out when a pair of vertical Bloch lines is not placed at an extremity of a magnetic domain 22 with a single Bloch line b4 alone placed at the extremity of the magnetic domain 22, as shown in FIG. 4(a). Like in FIG. 3(a), the magnetic domain 22 is retracted leftwards of FIG. 4(a) to move the single Bloch line b4 towards a predetermined one of flank walls of the magnetic domain 22. In this event, the single Bloch line b4 is returned back to the extremity of a retracted stripe domain, like the righthand side Bloch line illustrated in FIG. 3(b). Thereafter, the magnetic domain 22 is stretched rightwards like in FIG. 3(b) to locate the single Bloch line b4 on the lefthand side of the first conductor 26. Under the circumstances, the fourth and the fifth conductors 29 and 30 are supplied with electric currents, as shown in FIG. 4(c). In this event, no Bloch line is present at an extremity of a stretched stripe domain shown in FIG. 4(c). Therefore, the stretched stripe domain is not chopped, as shown in FIG. 4(d).

Herein, it is to be noted in FIGS. 1(a) and 3(b) that the Bloch line b1 and the righthand Bloch line b3 must be precisely located at the extremity of the stripe domain 22 to be moved clockwise to the predetermined, namely, lower flank wall of the stripe domain 22. Otherwise, the write-in and the readout operations can not be precisely carried out.

To this end, the in-plane magnetic field Hino should be oriented in the predetermined or longitudinal direction of the stripe domain 22. Inasmuch as the inplane magnetic field Hino is nevertheless given from an outside of the chip which comprises a great number of the stripe domains, as mentioned before, it is practically very difficult to make the direction of the inplane magnetic field Hino coincide with the predetermined direction, although no problem takes place in FIG. 4 when the single Bloch line is moved either on the upper flank wall of the stripe domain 22 or on the lower flank wall.

Figure 5A:
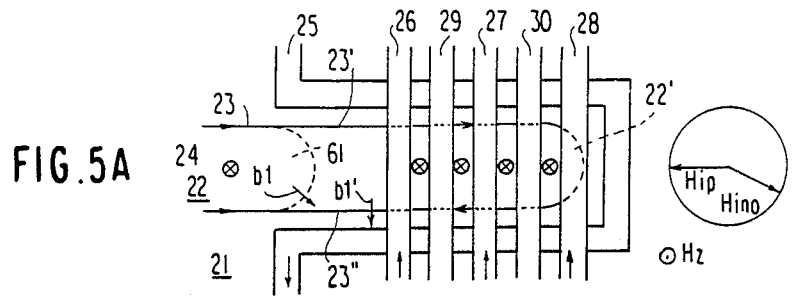
FIGS. 5(a) through (c) are plan views for use in describing a write-in operation of a magnetic memory device according to a first embodiment of this invention.
Figure 5B:
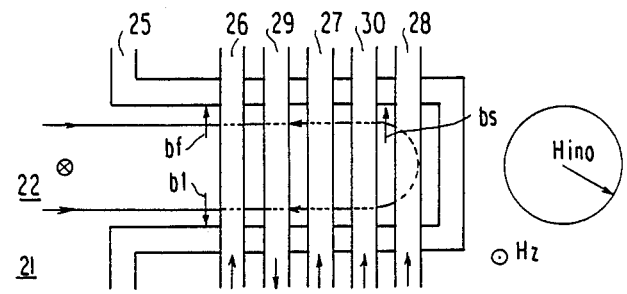
Figure 5C:
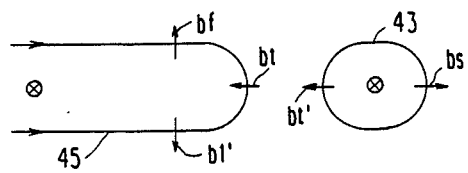

Referring to FIGS. 5(a) through (c), a magnetic memory device according to a first embodiment of this invention comprises similar parts designated by like reference numerals and symbols. The illustrated magnetic memory device is for use in writing a pair of vertical Bloch lines into a magnetic domain 22 having an extremity 61 depicted at a broken line, although a readout operation can be also carried out by the use of the same structure, as will become clear later. In the example being illustrated, a bias magnetic field Hz is provided outside of the magnetic domain 22 frontward of this figure. In this connection, magnetization is directed within the stripe domain 22 backward, as shown by an encircled crisscross 24. Like in FIG. 1, the hairpin-shaped conductor 25 is placed in the vicinity of the extremity 61 of the magnetic domain 22 and can surround the hairpin-shaped conductor 25, as shown in FIG. 5(a) even when the stripe domain 22 is stretched along a predetermined or longitudinal direction. In addition, the first through the fifth conductors 26 to 30 intersect the hairpin-shaped conductor 25.

It is to be noted here that an in-plane magnetic field Hino is deflected relative to the predetermined direction within an angle range and may be therefore called a deflected in-plane magnetic field Hino. The angle range may be between plus 90° and minus 90° and is divided into a clockwise angle range and a counterclockwise angle range with respect to the predetermined direction. The illustrated deflected in-plane magnetic field Hino is practically deflected at a deflected angle of 45° to the predetermined direction within the clockwise angle range, as shown on the righthand side of FIG. 5(a). From this fact, it is readily understood that such a deflected angle may be determined either within the clockwise angle range or within the counterclockwise angle range and may not be accurately determined, differing from the in-plane magnetic field Hino illustrated with reference to FIG. 1. Under the circumstances, a single vertical Bloch line b1 is placed at a position which is deflected from the extremity of the stripe domain 22 at an angle determined by the deflected angle of the deflected in-plane magnetic field Hino.

Figure 6:
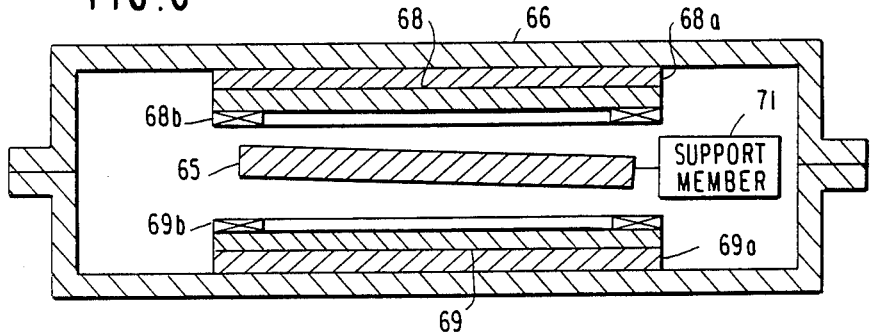
FIG. 6 is a sectional view of the magnetic memory device illustrated in FIGS. 5(a) through (c)

Temporarily referring to FIG. 6 together with FIG. 5(a), the magnetic memory device illustrated in FIG. 5 practically comprises a chip 65 of a magnetic medium which has a pair of principal surfaces frontward and backward of FIG. 6 and on which a plurality of stripe domains, as shown in FIG. 5, are disposed in parallel to one another. The illustrated chip 65 is accommodated within an internal space of a package 66 and is interposed between a pair of magnetic units 68 and 69 within the internal space. As a result, the magnetic units 68 and 69 are adjacent to the principal surfaces, respectively. Each of the magnetic units 68 and 69 is operable to generate the bias magnetic field Hz and the deflected in-plane magnetic field Hino. More specifically, the magnetic units 68 and 69 comprise permanent magnets 68a and 69a and coils 68b and 69b, respectively.

In the illustrated magnetic memory device, the chip 65 is inclined relative to the magnetic units 68 and 69 by the use of a support member symbolized by 71, as shown in FIG. 6, so as to generate the deflected in-plane magnetic field Hino in addition to the local pulsed in-plane magnetic field Hip. Such a chip angle is determined in relation to the angle range of the deflected in-plane magnetic field Hino. Thus, it is possible to generate the deflected in-plane magnetic field Hino by inclining the chip 65 relative to the magnetic units 68 and 69. In this event, the chip 65 may be movably coupled to the support member 71 to adjust the chip angle of the chip 65 to a desired angle.

At any rate, a combination of the magnetic units 68 and 69 and the support member 71 serves to apply the deflected in-plane magnetic field onto the chip 65 and will be referred to as a magnetic field applying unit for applying the deflected in-plane magnetic field.

Referring back to FIG. 5(a), the electric currents are given to flow through the first through the third conductors 26 to 28 upwards of FIG. 5(a) while the pulsed current is concurrently given to flow through the hairpin-shaped conductor 25 downwards of FIG. 5(a), like in FIG. 1(a). As a result, a local pulsed in-plane magnetic field Hip is generated in a direction reverse or opposite to that of the in-plane magnetic field Hino, as illustrated in FIG. 5(a) and stretches the stripe domain 22 into a stretched stripe domain 22′ in a rightward sense of FIG. 5(a) along the predetermined or longitudinal direction of the stripe domain 22, as depicted by a broken line in FIG. 5(a). The stretched stripe domain 22′ has an end wall and upper and lower flank walls connected to the end wall 23′ and 23″. During the stretching of the stripe domain 22, the clockwise gyrotropic force acts on the single Bloch line b1. The resultant Bloch line b1 is shifted towards the lower flank wall 23″ and stabilized at a lefthand side position of the first conductor 26 due to interaction between the gyrotropic force and the local pulsed in-plane magnetic field Hip, as illustrated in FIG. 5(a). Therefore, the end wall of the stretched stripe domain 22′ is put into the χ-state, as illustrated in FIG. 5(a).

Figure 7:
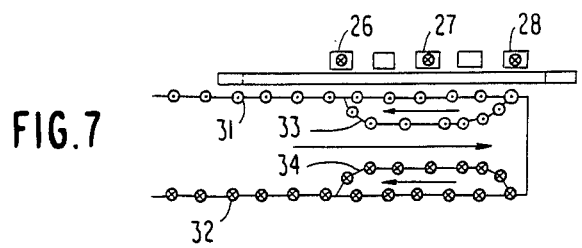
FIG. 7 shows, in cross section, a stripe domain illustrated in FIGS. 5(a) through (c)

In this event, the horizontal Bloch lines 33 and 34 are formed under the first through the third conductors 26 to 28 in each of the flank walls of the stretched stripe domain 22′, as illustrated in FIG. 7.

Subsequently, the fourth and the fifth conductors 29 and 30 are supplied with electric currents which are given to flow in reverse senses to each other, as illustrated in FIG. 5(b). Such supply of the electric currents to the fourth and the fifth conductors 29 and 30 brings about generation of a local pulsed magnetic field between the fourth and the fifth conductors 29 and 30. The local pulsed magnetic field is oriented in the same sense as the bias magnetic field Hz and brings about occurrence of the first and the second Bloch lines bf and bs on the lefthand sides of the first and the third conductors 26 and 28, respectively, with the single Bloch line b1 trapped in the lower flank wall. This operation is similar to that illustrated in conjunction with FIG. 1(b) except that the deflected in-plane magnetic field Hino is applied to the magnetic medium 21 illustrated in FIG. 5(b). Thus, the first and the second Bloch lines 41 and 42 are transiently injected or written into the stretched stripe domain 22′.

In FIG. 5(c), the electric currents are continuously given to flow through the fourth and the fifth conductors 29 and 30 to chop the stretched stripe domain into a magnetic bubble 43 and a remaining stripe domain 45. Thus, the vertical Bloch lines bf and bt are left in the remaining stripe domain 45, as shown in FIG. 5(c) and are written into the remaining stripe domain 45. As known in the art, the vertical Bloch lines bf and bt are of negative types. Referring to FIGS. 8(a) through (d), description will be made as regards a readout operation which is carried out in the magnetic memory device according to the first embodiment of this invention. The readout operation illustrated in FIGS. 8(a) through (d) is similar to that illustrated in FIGS. 3(a) to (d) except that the deflected in-plane magnetic field Hino is applied to the magnetic medium 21 during the readout operation, as shown on the righthand sides of FIGS. 8(a) to (c).

More specifically, three of Bloch lines 50 are at first moved at an end portion of a stripe domain 22 depicted at a broken line and are shifted from an extremity of the end portion to a stabilizing position by virtue of the deflected in-plane magnetic field Hino. In the example being illustrated, the three Bloch lines 50 are placed at the stabilizing position rotated clockwise from the extremity of the end portion. The Bloch lines 50 are composed of a center Bloch line bc, a lefthand Bloch line b2, a righthand Bloch line b3 like in FIG. 3(a). Under the circumstances, an electric current is given to flow through the hairpin-shaped conductor 25 to generate a pulsed bias magnetic field in the leftward sense and to retract the end portion of the stripe domain leftwards of FIG. 8(a). As a result, the three Bloch lines 50 are shifted counterclockwise to be located at an end portion of a retracted stripe domain as shifted Bloch lines 50′. In this situation, the righthand Bloch line b3 is nearest to the extremity of the retracted stripe domain and interacts with the deflected in-plane magnetic field Hino.

Figure 8A:
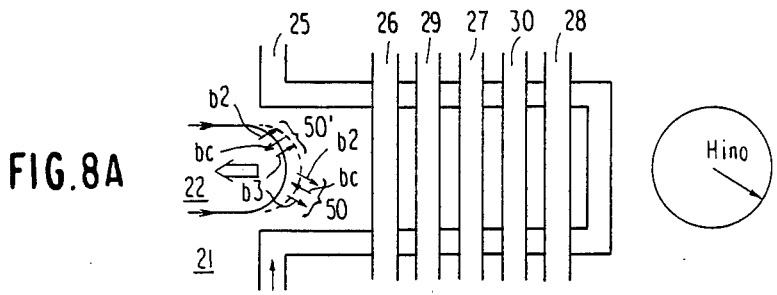
FIGS. 8(a) through (d) are plan views for use in describing a readout operation of the magnetic memory device illustrated in FIG. 6.
Figure 8B:
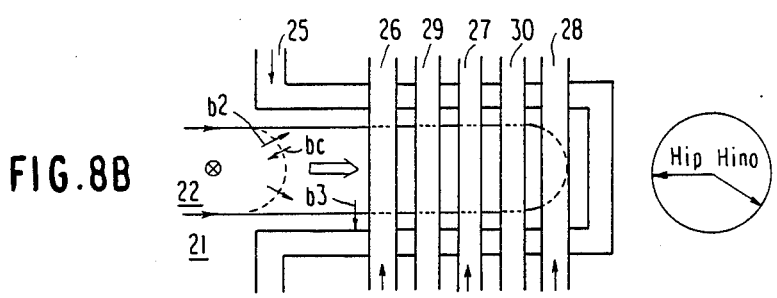

Consequently, only the righthand Bloch line b3 is rotated clockwise and returned back to the previous stabilizing position, as shown at b3' in FIG. 8(b) with the remaining two Bloch lines bc and b2 kept unchanged. Thus, the righthand Bloch line b3' is directed to the same direction as the deflected in-plane magnetic field Hino. Under the circumstances, electric currents are given to flow through the first through third conductors 26 to 28 upwards of FIG. 8(b) to generate a local in-plane magnetic field Hip directed to a sense reverse to that of the deflected in-plane magnetic field Hino. Simultaneously, a pulsed electric current is given to flow through the hairpin-shaped conductor 25 downwards of FIG. 8(b). As a result, a pulsed local in-plane magnetic field Hip is generated in a sense reverse to that of the deflected in-plane magnetic field Hino. Due to application of the local in-plane magnetic field, the retracted stripe domain is stretched rightwards of FIG. 8(b), as shown by a broken line. During the stretching of the stripe domain, gyrotropic force acts clockwise on the righthand Bloch line b3 to be stabilized on the lower flank wall at the lefthand side position of the first conductor 26.

Figure 8C:
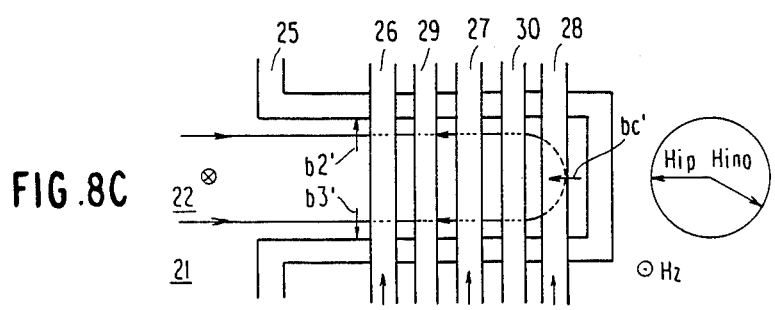

On the other hand, the center and the lefthand Bloch lines bc and b2 are kept at an extremity of the stretched stripe domain and at a position located on the lefthand side of the first conductor 26, as depicted at bc' and b2', respectively, as shown in FIG. 8(c). Thus, the center, the lefthand, and the righthand Bloch lines bc, b2, and b3 are separated from one another and accurately arranged at the extremity, the upper flank wall, and the lower flank wall of the stripe domain 22, respectively, as shown at bc', b2', and b3' in FIG. 8(c). It is to be noted that wall magnetization is parallel to each other on the upper and the lower flank walls, as illustrated in FIG. 8(c), when the three Bloch lines are arranged on the strstched stripe domain in a manner illustrated in FIG. 8(c).

Figure 8D:
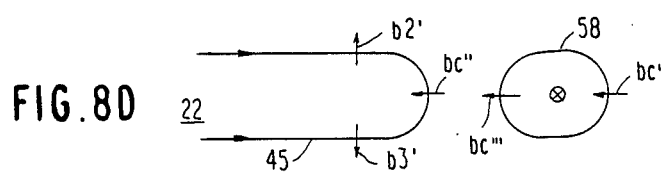

Thereafter, the electric currents are given to flow through the fourth and the fifth conductors 29 and 30 in reverse senses to chop the stretched stripe domain into a magnetic bubble 58 and a remaining stripe domain 45, as illustrated in FIG. 8(d). As a result, the center Bloch line bc' is replacated in the magnetic bubble 58 and the remaining stripe domain 45 as depicted at bc'" and bc" as illustrated in FIG. 8(d), respectively. Thus, the three Bloch lines are accurately separated from one other as shown in FIGS. 8(a) through (d) by applying the deflected in-plane magnetic field Hino which does not coincide with the predetermined direction.

Figure 9:
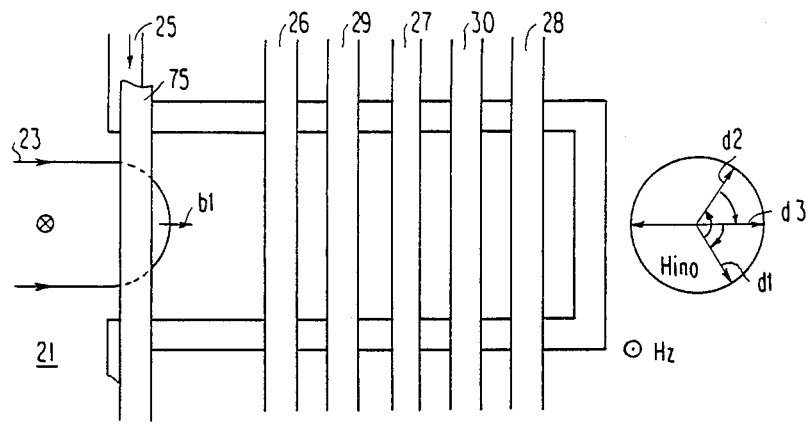
FIG. 9 is a plan view for use in describing a magnetic memory device according to a second embodiment of this invention.

Referring to FIG. 9, a magnetic memory device according to a second embodiment of this invention is similar in structure to that illustrated in FIGS. 5 through 8 except that an additional conductor 75 is partially overlapped with the hairpin-shaped conductor 25 and that the support member 71 (FIG. 6) can vary an inclination or deflected angle of the chip 65 to change a sense of the in-plane magnetic field Hino from one to another. In the example being illustrated, the sense of the in-plane magnetic field Hino can be directed to a first sense d1, a second sense d2, and a third sense d3, as illustrated on the righthand side of FIG. 9. The first sense d1 is deflected by about 45 degrees to the predetermined or longitudinal direction of the stripe domain 21 clockwise while the second sense d2 is azimuthally rotated counterclockwise from the predetermined direction within an angle range of 90°. The third sense d3 may be substantially directed to the predetermined direction. It is possible to vary the sense of the in-plane magnetic field Hino by inclining the angle of the chip 65 (FIG. 6) relative to the magnetic units 68 and 69. In addition, the bias magnetic field Hz is applied frontwards of this figure while the magnetization within the stripe domain is directed backwards of this figure like in FIG. 5. Moreover, the illustrated structure of the magnetic memory device illustrated in FIG. 9 can be used in common to a write-in operation and a readout operation like the magnetic memory device illustrated in FIG. 5. At any rate, the end portion of the stripe domain 21 is located under the additional conductor 75, as illustrated in FIG. 9. In FIG. 9, a single Bloch line b1 is placed at an extremity of the end portion of the stripe domain 21 like in FIG. 5 so as to carry out the write-in operation of a pair of vertical Bloch lines in a manner to be described later.

Figure 10A:
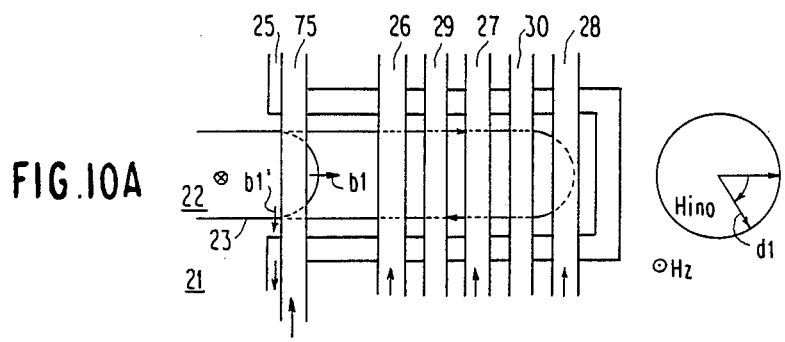
FIGS. 10(a) through (c) are plan views for use in describing a write-in operation of the magnetic memory device illustrated in FIG. 9.
Figure 10B:
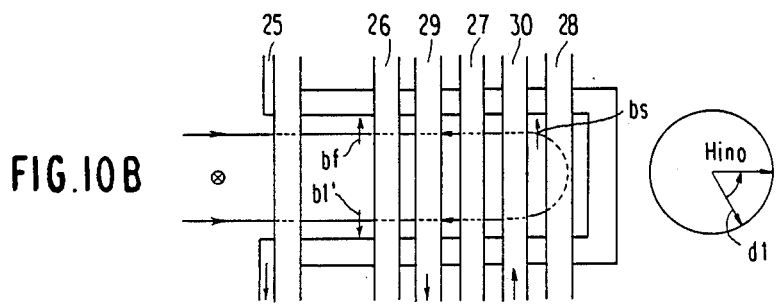

Referring to FIG. 10, description will be made as regards the write-in operation of the magnetic memory device illustrated in FIG. 9. In this event, the single Bloch line b1 which is located at the extremity of the stripe domain 21 should be shifted to the lower flank wall of the stripe domain 21, as mentioned in conjunction with FIG. 5(a). At first, the in-plane magnetic field Hino is assumed to be directed to the first sense d1, as shown on the righthand side of FIG. 10(a). Under the circumstances, an electric current is given to flow through the additional conductor 75 upwards of FIG. 10(a) to generate a local inplane magnetic field Hin which is directed in a reverse sense to the above-mentioned in-plane magnetic field Hino and which is applied to the end portion of the stripe domain 21. Thereafter, the in-plane magnetic field Hino is azimuthally rotated clockwise within an angle range of 90° by driving the support member 71 (FIG. 6). Thus, a deflected magnetic field is applied to the stripe domain 21 to rotate the single Bloch line b1 clockwise towards the lower flank wall and serves to direct the single Bloch line towards the first sense d1. Under the circumstances, the single Bloch line b1 interacts with both the local in-plane magnetic field Hip and the in-plane magnetic field Hino. As a result, the single Bloch line b1 is trapped on the lefthand side of the additional conductor 75, as depicted at b1' and may be called a trapped Bloch line.

After the single Bloch line b1' is trapped, the first through the third conductors 26 to 28 are supplied with the electric currents upwards of FIG. 10(a) while the hairpin-shaped conductor 25 is supplied with a pulsed electric current downwards of FIG. 10(a). Thus, a pulsed local magnetic field Hip is applied to the end portion of the stripe domain 21 in a sense reverse to that of the in-plane magnetic field Hino. At any rate, the end portion of the stripe domain 21 is stretched on the righthand side of the additional conductor 75 due to a pulsed local magnetic field Hip, as shown at a broken line in FIG. 10(a) with the trapped Bloch line b1' kept unmoved. In this state, wall magnetization is put into the χ-state at the stretched end portion of the stripe domain 21, as readily understood from FIG. 10(a). In this event, horizontal Bloch lines 33 and 34 are formed on the upper flank wall of the stretched stripe domain 21, as illustrated in FIG. 11, like in FIG. 7.

Figure 10C:
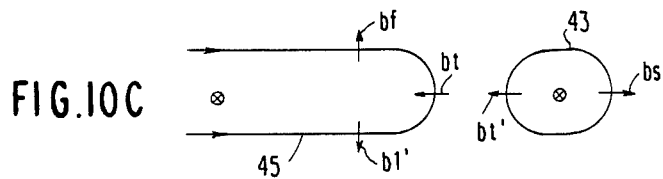
Figure 11:
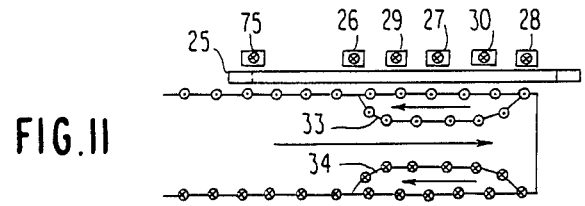
FIG. 11 shows, in cross section, a stripe domain illustrated in FIG. 10.

Subsequently, the fourth and the fifth conductors 29 and 30 are supplied with electric currents in reverse senses to each other to provide a pulsed magnetic field directed in the same sense as the bias magnetic field Hz in a region interposed between the fourth and the fifth conductors 29 and 30, as shown in FIG. 11 and FIG. 10(c). As a result, punch through takes place between the horizontal Bloch lines 33 and 34 in a manner similar to that illustrated in conjunction with FIG. 7. When supply of the electric current to the additional conductor 75 is stopped in the above-mentioned state with the fourth and the fifth conductors 29 and 30 being continuously supplied with the electric currents, vertical Bloch lines bf and bs are transiently written or injected into the end portion of the streched stripe domain 21 and are located on the lefthand sides of the first and the third conductors 26 and 28, respectively, with the trapped Bloch line b1' moved from the lefthand side of the first additional conductor 75 to the lefthand side of the first conductor 26, as illustrated in FIG. 10(c).

When the electric currents are continuously given to flow through the fourth and the fifth conductors 29 and 30 after injection of the vertical Bloch lines bf and bs, the stretched stripe domain is chopped into a magnetic domain 43 and a remaining magnetic domain 45, as shown in FIG. 10(c) like in FIG. 5. As a result, the vertical Bloch lines bf and bt of negative types are written into an end portion of the remaining magnetic domain 46 in the manner described in conjunction with FIG. 5. Thereafter, the in-plane magnetic field Hino is returned back to the predetermined direction, as symbolized at an arrow within the circle drawn in the righthand side of FIG. 10(b).

Figure 12A:
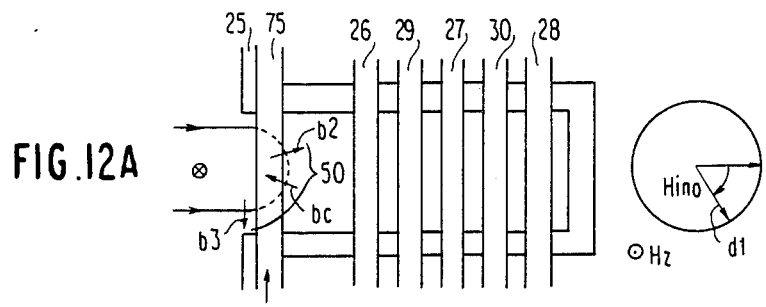
FIGS. 12(a) through (d) are plan views for use in describing a readout operation of the magnetic memory device illustrated in FIG. 9.
Figure 12B:
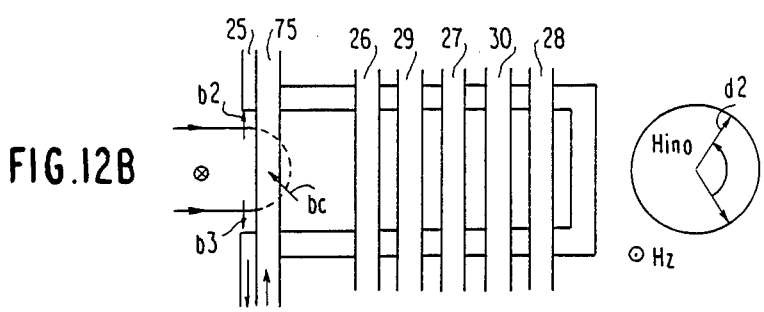
Figure 12C:
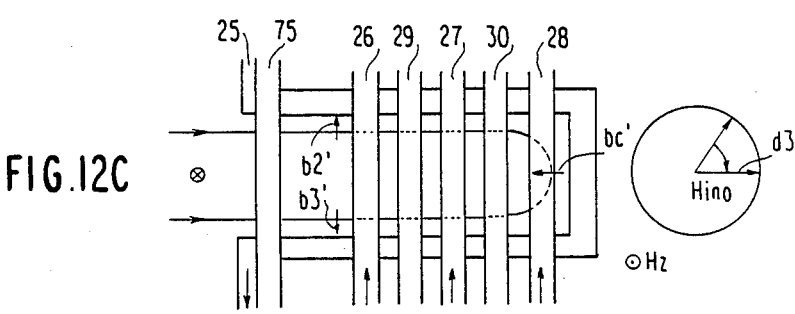
Figure 12D:
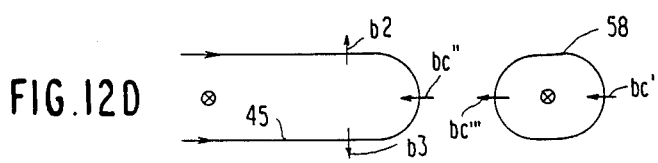

Referring to FIGS. 12(a) through (c), the readout operation will be described in the magnetic memory device illustrated in FIG. 9. In this event, it is assumed that a pair of Bloch lines are located at the end portion of the stripe domain 21 together with a single Bloch line, like in FIG. 8. Therefore, three of Bloch lines are arranged at the end portion of the stripe domain 21 and are collectively depicted at 50 and will be referred to as center, lefthand, and righthand Bloch lines bc, b2, and b3 like in FIG. 8. In addition, an inplane magnetic field Hino is assumed to be applied in the predetermined direction in a rightward sense by the use of the magnetic units 68 and 69 (FIG. 6). Moreover, the bias magnetic field Hz is directed in a frontward sense of this figure while the magnetization is directed in a backward sense within the stripe domain 21.

At first, the additional conductor 75 is supplied with an electric current in an upward sense of FIG. 12(a) like in the write-in operation to apply a local in-plane magnetic field Hin in a sense reverse to the in-plane magnetic field Hino. Under the circumstances, the in-plane magnetic field Hino is rotated with respect to the predetermined direction by a predetermined angle which is smaller than 90°. Thus, the angle of 90° defines a predetermined angle range. In the example being illustrated, the in-plane magnetic field Hino is rotated about 45° clockwise and is oriented in the first sense d1, as symbolized at an arrow in the circle drawn on the righthand side of FIG. 12(a) and will be called a deflected in-plane magnetic field.

In this situation, the righthand Bloch line b3 interacts with the in-plane magnetic field Hino and the local in-plane magnetic field Hin to be moved clockwise towards a lower flank wall of the stripe domain 21. Eventually, the righthand Bloch line b3 is stabilized or trapped on the lower flank wall at a lefthand side position of the additional conductor 75, as illustrated in FIG. 12(a).

Subsequently, the in-plane magnetic field Hino is further rotated counterclockwise, as shown in the circle of FIG. 12(b), and is directed to the second sense d2. In this case, the second sense d2 is deflected relative to the predetermined direction at an angle smaller than 90°. Such rotation of the in-plane magnetic field Hino makes the lefthand Bloch line b2 interact with the in-plane magnetic field Hino and the local in-plane magnetic field Hin and dislocates the lefthand Bloch line b2 onto the upper flank wall of the stripe domain 21. Consequently, the lefthand Bloch line b2 is trapped on the upper flank wall at a lefthand side position of the additional conductor 75 with the center Bloch line bc kept at the end portion of the stripe domain 21, as illustrated in FIG. 12(b).

Thereafter, the in-plane magnetic field Hino is rotated clockwise so that it is directed to the third sense d3, as illustrated within a circle of FIG. 12(c). The resultant center Bloch line bc is placed at an extremity of the end portion of the stripe domain 21.

From this fact, it is readily understood that the three Bloch lines bc, b2, and b3 are separated from one another on the magnetic wall. After separation of the three Bloch lines, the readout operation is carried out in a manner similar to that illustrated in FIGS. 8(c) and (d). More specifically, the stripe domain 21 is stretched into a stretched stripe domain along the rightward sense d3 by supplying the first through the third conductors 26 to 28 with electric currents in the upward sense and by supplying the hairpin-shaped conductor 25 with a pulsed electric current in the downward sense. This means that a pulsed local magnetic field Hip is applied at the end portion of the stripe domain 21 in a reverse sense to the in-plane magnetic field Hino. The resultant center Bloch line bc is located at the extremity of the stretched stripe domain, as depicted at bc', while the resultant lefthand and righthand Bloch lines b2 and b3 are displaced at the lefthand side positions of the first conductor 26 on the upper and the lower flank walls, as depicted at b2' and b3' in FIG. 12(c), respectively. Such displacement of the lefthand and the righthand Bloch lines b2 and b3 results from interaction of both the Bloch lines b2 and b3 with the gyrotropic force and the pulsed local inplane magnetic field Hip. At any rate, wall magnetization between bc and b2 in the upper flank wall is parallel to wall magnetization between bc and b3 in the lower flank wall.

Thereafter, the fourth and the fifth conductors 29 and 30 are supplied with electric currents in opposite senses to chop the stretched stripe domain into a magnetic bubble 58 and a remaining stripe domain 45. As a result, a Bloch line bc''' which is identical with the lefthand Bloch line b2 is reciprocated in the magnetic bubble 58 while a Bloch line bc'' which is identical with the center Bloch line bc' is reciprocated in the remaining stripe domain 45.

When the readout operation is carried out in the presence of three Bloch lines in the above-mentioned manner, the three Bloch lines can be stably separated from one another to be held at predetermined positions as shown in FIG. 12(c). After such holding of the Bloch lines, a pulsed magnetic field is given to chop the stretched stripe domain.

On the other hand, when a single Bloch line alone is present at an end portion of a stripe domain, the single Bloch line is at first rotated to a selected one of the upper and the lower flank walls to put an end portion of the stripe domain into a unichiral state such that the end portion is not chopped by application of a pulsed magnetic field. In any event, it is possible to stably carry out the readout operation in comparison with the conventional method.

While this invention has thus far been described in conjunction with a few embodiments thereof, it will readily be possible for those skilled in the art to put this invention into practice in various other manners. For example, application of a deflected magnetic field is also helpful for facilitating propagation of each Bloch line around a stripe domain. Specifically, each end portion of the stripe domain is contiguous to a flank wall through a corner portion. According to the inventor's experimental studies, it has been found out that each Bloch line cannot be smoothly propagated at each corner of the stripe domain when the in-plane magnetic field is applied in the longitudinal direction. However, each Bloch line can be smoothly propagated through each corner portion when the deflected magnetic field is applied.

What is claimed is:

1. A magnetic memory device for use in selectively carrying out a write-in operation and a readout operation of a pair of vertical Bloch lines as an information unit in a domain wall of a stripe domain which is extended in a magnetic medium along a predetermined direction, said magnetic memory device comprising:

magnetic field applying means for applying a deflected in-plane magnetic field which is deflected at an angle relative to said predetermined direction; and operation control means for selectively controlling said write-in and said readout operations of said vertical Bloch line pair with said deflected in-plane magnetic field applied onto said stripe domain to carry out said write-in and said readout operations.

2. A magnetic memory device for use in selectively carrying out a write-in operation and a readout operation of a pair of vertical Bloch lines as an information unit in a domain wall of stripe domain which is extended in a magnetic medium along a predetermined direction, said magnetic memory device comprising:

magnetic field applying means for applying an in-plane magnetic field to direct said vertical Bloch line pair to said predetermined direction in said domain wall; and moving means for moving said magnetic medium and said magnetic field applying means relative to each other to vary said in-plane magnetic field within a preselected angle range from said predetermined direction to a direction different from said predetermined direction.

3. A magnetic memory device as claimed in claim 2, wherein said preselected angle range is preselected between plus 90 and minus 90 degrees with respect to said predetermined direction.

4. A magnetic memory device as claimed in claim 2, said stripe domain having a pair of ends along said predetermined direction, said magnetic memory device further comprising:

local in-plane magnetic field applying means for locally applying a local in-plane magnetic field in the vicinity of a selected one of said ends with said deflected in-plane magnetic field applied onto said stripe domain.

* * * * *